(12) United States Patent
Bonora et al.

(10) Patent No.: US 6,220,808 B1
(45) Date of Patent: Apr. 24, 2001

(54) ERGONOMIC, VARIABLE SIZE, BOTTOM OPENING SYSTEM COMPATIBLE WITH A VERTICAL INTERFACE

(75) Inventors: Anthony C. Bonora, Menlo Park, CA (US); William J. Fosnight, Austin, TX (US); Raymond S. Martin, San Jose, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/115,526

(22) Filed: Jul. 13, 1998

(51) Int. Cl.⁷ .................................................. B65G 49/07
(52) U.S. Cl. .......................... 414/217; 414/416; 414/439; 414/940
(58) Field of Search .................................. 414/217, 411, 414/416, 937, 939, 940

(56) References Cited

U.S. PATENT DOCUMENTS

| | | | |
|---|---|---|---|
| 5,601,484 | * | 2/1997 | Adler et al. ................... 414/940 X |
| 5,628,683 | * | 5/1997 | Gertischer ...................... 414/940 X |
| 5,653,565 | * | 8/1997 | Bonora et al. ................. 414/940 X |
| 5,655,869 | * | 8/1997 | Scheler et al. ................. 414/940 X |
| 5,674,039 | * | 10/1997 | Walker et al. ................. 414/940 X |
| 5,788,458 | * | 8/1998 | Bonora et al. ................. 414/940 X |
| 5,810,537 | * | 9/1998 | Briner et al. .................. 414/940 X |
| 5,885,045 | * | 3/1999 | Rush .............................. 414/940 X |
| 5,984,610 | * | 11/1999 | Rush et al. ......................... 414/416 |
| 6,013,920 | * | 1/2000 | Gordon et al. ................. 414/937 X |

* cited by examiner

Primary Examiner—Steven A. Bratlie
(74) Attorney, Agent, or Firm—Fliesler Dubb Meyer & Lovejoy LLP

(57) ABSTRACT

A system is described herein including a load port which allows various pod sizes, including 200 mm and 300 mm, add various configurations, including front opening and bottom opening, to operate with a BOLTS interface, or simply with a vertical port on the front end of a process tool in configurations not including the BOLTS interface.

19 Claims, 9 Drawing Sheets

ERGONOMIC, VARIABLE SIZE, BOTTOM OPENING SYSTEM COMPATIBLE WITH A VERTICAL INTERFACE

BACKGROUND OF THE INVENTION

1. Field of the Invention

The present invention relates to an interface for transferring workpieces such as semiconductor wafers, reticles and flat panel displays between a carrier for the workpieces and a process tool, and in particular to a system including a load port which allows various pod sizes and configurations to attach to and operate with a standard vertical interface on the front end of a process tool.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, Jul. 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles and molecular contaminants become of interest.

SMIF pods are in general comprised of a pod door which mates with a pod shell to provide a sealed environment in which wafers may be stored and transferred. At present, there are different configurations of SMIP pods owing in part to the different wafer sizes and tool interface orientations currently found in wafer fabs. In addition to existing 200 mm wafers, processing of 300 mm wafers has been introduced in recent years. Different pods and pod handling equipment are employed depending on whether processing is being performed on 200 mm or 300 mm wafers. Additionally, SMIF pods may either be bottom opening or front opening. In bottom opening SMIF pods, the pod door is provided horizontally at the bottom of the pod, and the wafers are supported in a cassette which is in turn supported on the pod door. In front opening pods, the pod door is located in a vertical plane, and the wafers are supported in parallel horizontal planes on shelves mounted within the pod shell. Such pods are commonly referred to as front opening unified pods, or FOUPs.

Bottom opening pods conventionally operate with horizontally oriented load port interfaces, and front opening pods conventionally operate with vertically oriented load port interfaces. Although 200 mm wafers may be stored and transported in either bottom or front opening pods, 200 mm wafers are typically used with bottom opening pods. Similarly, although 300 mm wafers may be stored and transported in either bottom or front opening pods, 300 mm wafers are now typically used with front opening pods.

Process tools typically include load ports affixed to their front end so that pods or stand-alone cassettes may be positioned adjacent the process tool in preparation for the wafers and/or wafer cassettes to be transferred into the process tool. For wafer fabs utilizing 300 mm wafers in front opening pods, a vertically oriented frame, commonly referred to as a box opener-loader tool standard interface (or "BOLTS" interface), has been developed by Semiconductor Equipment and Materials International ("SEMI"). The BOLTS interface attaches to, or is formed as part of, the front end of a process tool, and provides standard mounting points for a load port to attach to the process tool. The BOLTS interface also provides a reference position so that a fixed distance between the BOLTS interface and the center of a wafer on the load port may be defined. Thus, although equipment manufacturers make various configurations of load ports for 300 mm front opening pods, each load port may be operationally connected to a process tool as long as the load port is configured to attach to the defined standardized BOLTS interface frame.

In 300 mm front opening pods, a pod is typically loaded either manually or automatedly onto the load port so that the vertical pod door lies adjacent the vertical port door to the process tool. Thereafter, mechanisms within the load port advance the pod to the port, where the port door decouples the pod door from the pod shell and moves the pod door and port door together into the minienvironment and then off to the side, above or below the port. A wafer handling robot within the process tool may thereafter access particular wafers supported in the pod shell for transfer between the pod and the process tool. The wafer handling robot makes use of the known distance from the BOLTS interface to the wafer center to properly position the end effector of the robot with respect to a particular wafer being accessed.

Despite the potential increased capacity presented by chip manufacture from 300 mm wafers, several wafer fabs have been reluctant to switch from processing 200 mm wafers, and it is unlikely that an industry-wide conversion to 300 mm wafer processing will take place in the near future. The BOLTS interface was developed based on front opening 300 mm SMIF pods, and wafer fabs which utilize 200 mm wafers and/or bottom opening pods are not at present able to make use of the several advantages provided by the BOLTS interface.

Separate and apart from the problem presented by varying wafer sizes and pod types, several wafer fabs are not currently utilizing SMIF technology. Some of these fabs merely use bare cassettes, while other fabs use so-called "run boxes" around the cassettes to provide some degree of protection during storage and transport of the wafers. In either of these cases, when a cassette is transferred onto a load port, the wafers within the cassette are exposed to the cleanroom environment, where particulates and contaminants may deposit on the wafers. While it would be possible to provide a cleaner environment within a wafer fab or cleanroom surrounding a process tool, this approach is extremely expensive to implement for current wafer environment requirements.

SUMMARY OF THE INVENTION

It is therefore an advantage of the present invention to provide a SMIF load port allowing 200 mm, 300 mm or various other sized semiconductor wafers to be used with a BOLTS interface.

It is a further advantage of the present invention to provide a system for ergonomic loading of bottom opening pods to a BOLTS interfaced tool.

It is another advantage of the present invention to provide a load port allowing bottom opening pods to be used with a vertically oriented port to a process tool.

It is a further advantage of the present invention to allow wafer fabs that do not use SMIF technology to provide a cost effective clean environment around a cassette after it has been moved from a run box onto a load port.

It is a still further advantage of the present invention to provide wafer mapping, monitoring and/or identification in a SMIF load port mounted to a BOLTS interface.

It is another advantage of the present invention to allow automated transport of pods to and from a load port regardless of whether the pod is a 200 mm or 300 mm pod.

It is another advantage of the present invention that it allows process tool suppliers to market 200 mm SMIF versions of 300 mm tools.

It is a still further advantage of the present invention that it allows semiconductor chip manufacturers to purchase 300 mm-ready equipment while continuing to operate with 200 mm pods.

These and other advantages are provided by the present invention which in preferred embodiments relates to an ergonomic system for allowing I/O compatibility for various sized pods, including 200 mm and 300 mm pods, as well as various configurations of pods and carriers, including front opening pods, bottom opening pods, and bare cassettes. Typically, a BOLTS interface and vertical load port on a process tool are configured to receive 300 mm front opening pods. However, the system according to the present invention includes a bottom opening load port which allows various pod sizes and configurations to operate with a BOLTS interface, or simply with a vertical port on the front end of a process tool in configurations not including the BOLTS interface.

The SMIF load port according to the present invention allows ergonomic loading at approximately 900 mm, as per applicable SEMI standards, and provides the ability to present the first wafer at approximately the same height as a 300 mm front opening load port. In a preferred embodiment, the bottom opening SMIF load port includes a support plate assembly and a minienvironment affixed to a bottom surface of the support plate assembly. The size of the minienvironment is preferably small, but is large enough to fully enclose a wafer carrying cassette. The support plate assembly is located adjacent to the vertically oriented process tool load port, and includes a stationary inner support plate surrounded by a translating outer support plate. The support plate assembly lies in a substantially horizontal plane and is configured to accept bottom opening pods of various sizes, such as for example 200 mm pods. When a pod is properly located on the support plate assembly, the pod door lies in contact with the inner support plate and the outer rim of the pod shell lies in contact with the outer support plate. The outer support plate is preferably affixed to an elevator drive system, such as for example one or more lead screws, so that once mechanisms within the inner support decouple the pod door from the pod shell, the outer support plate, pod shell and the minienvironment may be raised upwards while the inner support plate, and pod door and pod cassette supported thereon remain stationary. The pod shell provides a seal over the opening formerly occupied by the inner support plate.

The outer support plate and minienvironment will move upwards while the inner support plate and cassette remain stationary so that, when the outer support plate and minienvironment are sufficiently raised, the cassette will be fully enclosed within the minienvironment. The minienvironment includes an opening in its front wall, i.e., the wall adjacent to the BOLTS interface and process tool, which opening aligns with the tool load port when the minienvironment is raised upward. Once the minienvironment is positioned around the wafer cassette and the opening in the minienvironment is aligned with the load port opening, a wafer handling robot from within the process tool can transfer wafers between the wafer cassette and the process tool. While wafer transfer to and from the cassette occurs, the wafers are fully contained within the minienvironment to maintain the wafers in a cleanroom environment while they are separated from the pod.

Another feature of a load port according to the present invention is the ability to perform wafer mapping, identification, and position verification. Various optical emitters and sensors may be mounted on the outer support plate, so that as the outer support plate moves upward past each of the wafers in the cassette, identification and positional information from each of the wafers may be obtained and stored for later use. Additionally, if the sensors detect an improperly positioned wafer, for example one that is cross-slotted or protruding from the cassette, corrective measures are taken.

The present invention further alloys automated transfer of a SMIF pod to and from the load port regardless of whether the pod is a 200 mm or 300 mm pod. After wafer processing has been completed on 200 mm wafers, and the pod door has been recoupled to the pod shell, the outer support plate may lift the sealed pod to an elevation where the automated pod transfer device expects to encounter the pod handle on a top of the pod. When loading a pod onto the support plate assembly by automated transfer mechanisms, the outer support plate may initially be raised to a particular elevation where the automated transfer device may deposit a pod onto the outer support plate, and thereafter the outer support plate may lower to properly seat the pod door on the inner support plate.

According to a further alternative embodiment of the present invention, the system may be configured to operate in wafer fabs which do not utilize SMIF technology or where a cassette is otherwise located directly on a load port of a process tool. In such an alternative embodiment, a cassette is positioned on a horizontal stationary support plate. Thereafter, a minienvironment as described above may move upward around the cassette. A sealing platform may be provided at some vertical height above the support platform so that, as the minienvironment moves upward, the upper edges of the minienvironment will contact the sealing platform to thereby provide a sealed environment around the wafer cassette. Thereafter, the wafer handling robot within the process tool may transfer wafers between the wafer cassette and the process tool while the wafer cassette is maintained in the clean air of the minienvironment. In a further alternative embodiment, the sealing platform described above may be omitted. In such an embodiment, the relatively higher pressure within the minienvironment generated by the fan/filter unit and/or by the process tool can be used to ensure that particulates and contaminants from outside of the minienvironment do not enter the minienvironment.

BRIEF DESCRIPTION OF THE DRAWINGS

The present invention will now be described with reference to the drawings, in which.

DETAILED DESCRIPTION

The present invention will now be described with reference to FIGS. 1 through 8, which in general relate to a system allowing I/O compatibility for 200 mm and 300 mm pods, as well as front and bottom opening pods. While the present invention is described with respect to the processing of semiconductor wafers, it is understood that the present invention may operate with various other workpieces including reticles and flat panel displays. As used herein, the terms "wafer" and "semiconductor wafer" refer to a semiconductor wafer as it may exist in any of the various stages of fabrication. While a preferred embodiment of the invention may operate with SMIF pods, it is understood that the type of pod utilized is not critical to the present invention and any of various containers in which semiconductor wafers are housed may operate with the present invention. It is further understood that the present invention complies with and allows compliance with all applicable SEMI standards.

Additionally, as explained in greater detail below, although a preferred embodiment of the present invention allows 200 mm and bottom opening pods be used in conjunction with a BOLTS interface, it is understood that a BOLTS interface is not critical to the present invention. In alternative embodiments, the present invention may allow 200 mm and bottom opening pods to be used on a 300 mm front opening interface to a process tool not including a BOLTS interface.

Figure 1:
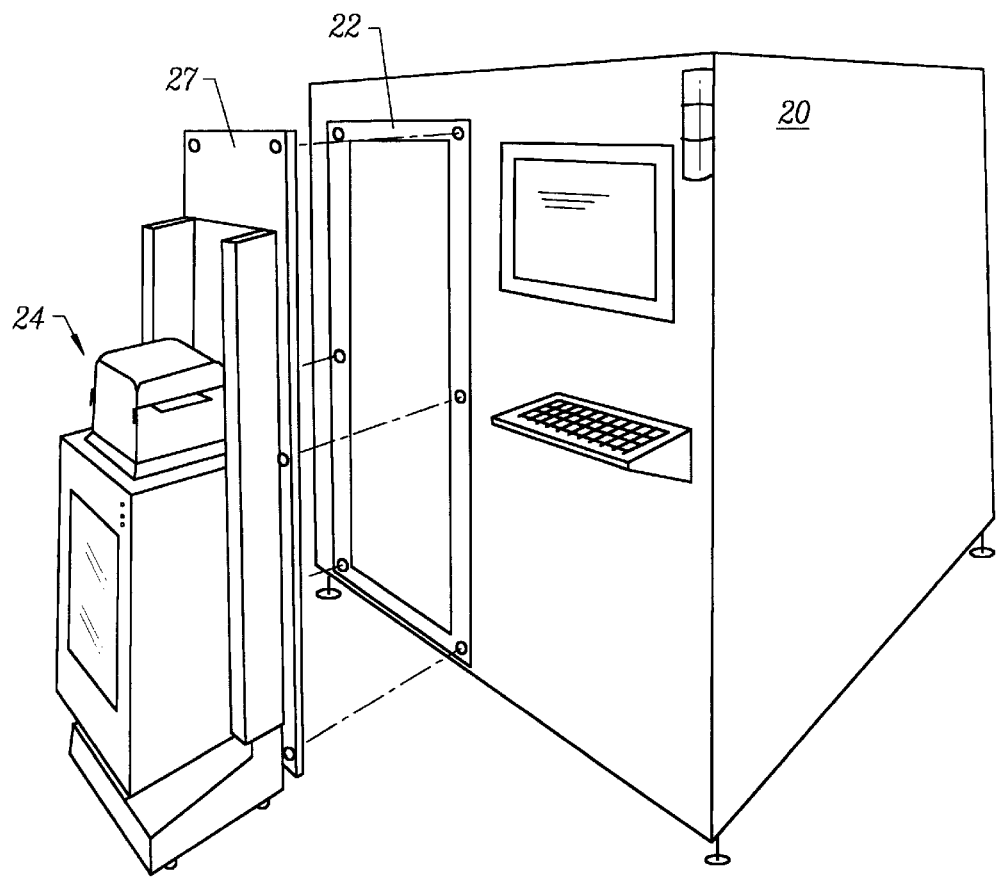
FIG. 1 is an exploded perspective view of a process tool BOLTS interface and load port according to the present invention.
Figure 2:
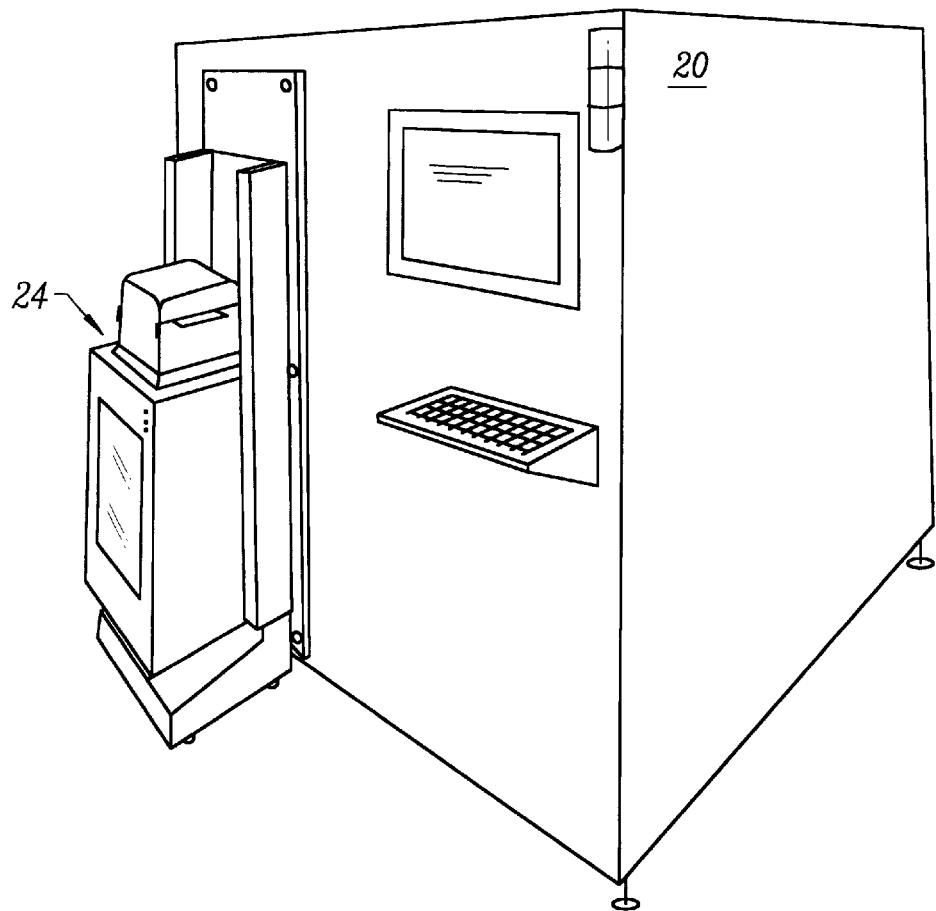
FIG. 2 is a perspective view of a load port according to the present invention affixed to a BOLTS interface, which is in turn affixed to a process tool.
Figure 3:
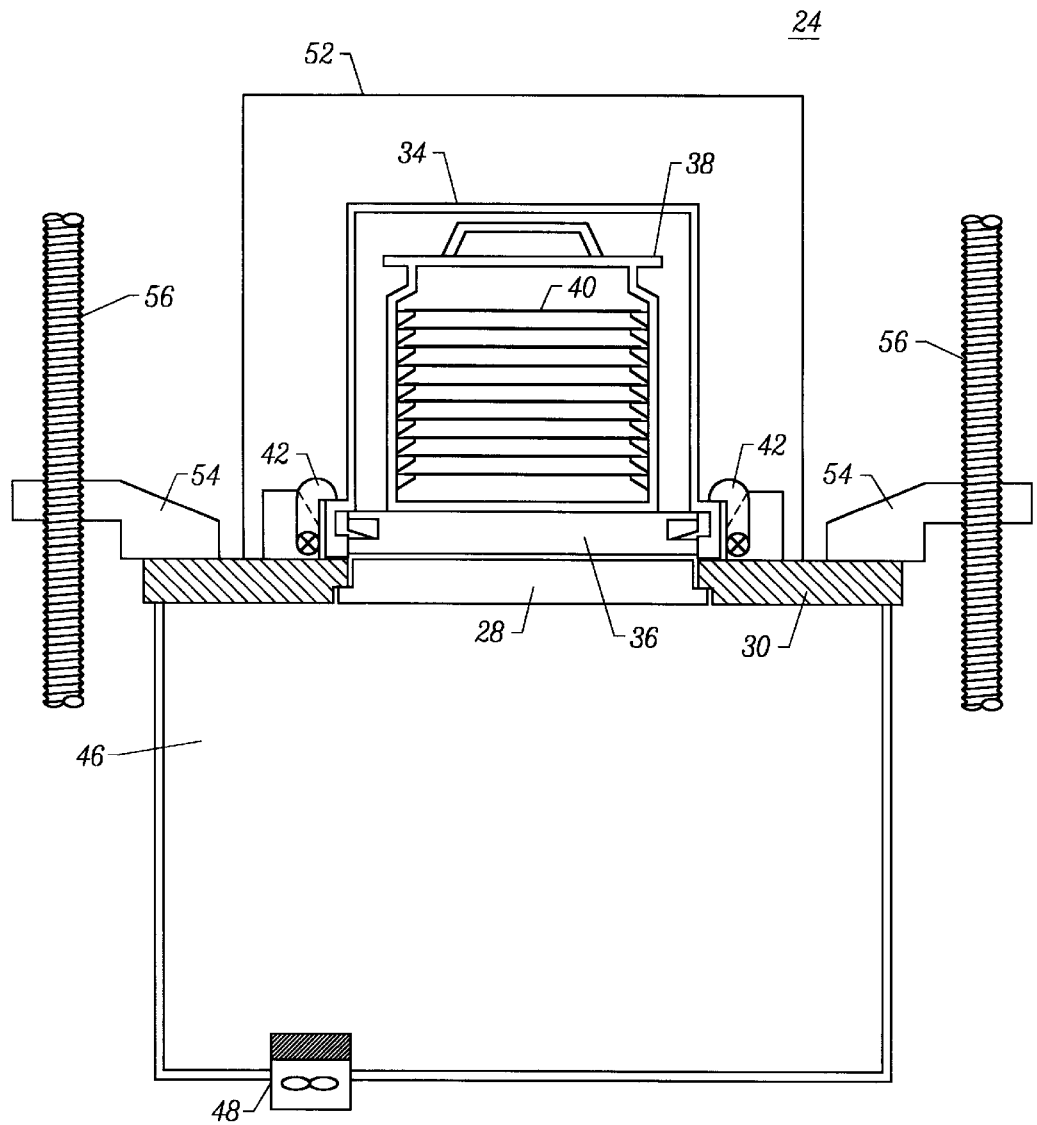
FIG. 3 is a front view of the load port according to the present invention with a pod seated thereon.

FIG. 1 is an exploded perspective view of a process tool 20, a BOLTS interface 22 and a load port 24 according to the present invention. FIG. 2 is a perspective view showing process tool 20, the BOLTS interface 22 and the load port 24 assembled together. While FIGS. 1 and 2 illustrate a single load port 24 affixed to the front end of the process tool 20, it is understood that more than one load port 24 may be provided in alternative embodiments. Moreover, it is contemplated that both a standard 300 mm front opening load port and a load port 24 according to the present invention be provided on a single process tool 20.

Figure 1A:
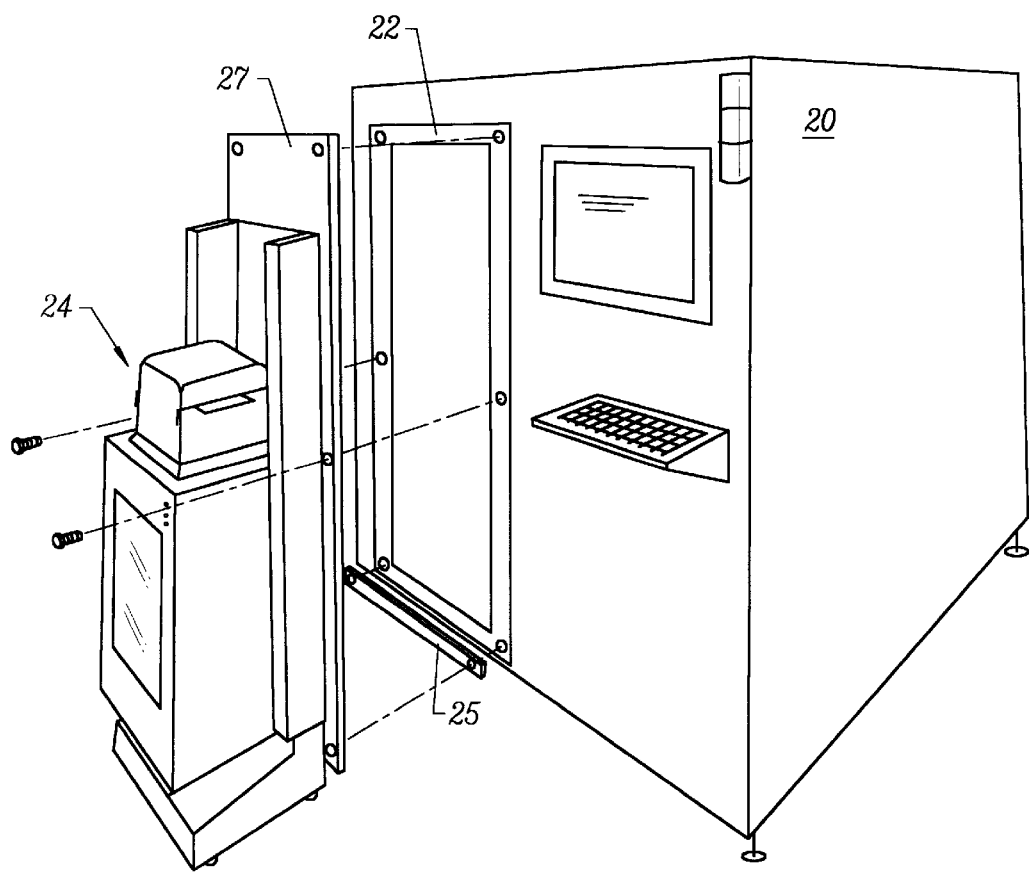
FIG. 1A is an exploded perspective view of a process tool BOLTS interface and load port according to the present invention further including a tilt and go attachment for facilitating attachment of the load port to the BOLTS interface.

In embodiments of the present invention, in order to facilitate attachment of the load port 24 to the BOLTS interface, a "tilt and go" attachment system 25 (FIG. 1A) may be provided on the load port and BOLTS interface. Such a system is described in U.S. Provisional Patent Application Ser. No. 60/057,887, entitled "Tilt and Go Front Load Interface Alignment System", to Bonora et al., which application is assigned to the owner of the present invention, and which application is incorporated by reference herein in its entirety.

Moreover, an adapter plate 27 may also be provided between the BOLTS interface 22 and the load port 24. This adapter plate allows, for example, smaller 200 mm load ports 24 to interface with the BOLTS frame. As shown in FIG. 1, the plate may be provided as part of, and particularly configured for, a particular load port. Alternatively, the adapter may be provided as part of the BOLTS interface. In this latter embodiment, the plate may be generically designed so as to work with load ports of various configurations. For example, some load ports receive a pod at a particular height and thereafter translate the wafer carrier to a lower elevation for loading into the process tool. However, a load port such as that of the present invention preferably loads wafers from the same elevation at which it receives the carrier. As such, an adapter plate on a BOLTS interface would preferably include one or more openings to allow wafer loading from both of the above-described elevations. In further embodiments of the invention, the adapter plate on the BOLTS interface may make use of the tilt and go attachment system described above.

Referring now to FIGS. 3 and 4A–4C, the load port 24 includes a support plate assembly 26 having a horizontally oriented inner support plate 28 substantially coplanar with, and surrounded by, an outer support plate 30. While it is understood that the port plate assembly 26 may be configured to accept bottom opening pods of various sizes, according to a first embodiment of the present invention, load port 24 is configured to support a 200 mm bottom opening SMIF pod 32 including a pod shell 34 mating with a pod door 36. The pod shell and pod door together define a sealed environment for a wafer cassette 38 including one or more wafers 40. The wafer cassette 38 is preferably supported on the pod door 36. The load port 24 provides an ergonomic design by allowing operators to locate a bottom opening pod on the load port at 900 mm, while also presenting a first wafer to the tool at the same or similar height as a 300 mm front opening load port.

When properly located on the support plate assembly, the pod door lies in contact with the inner support plate 28, and the outer rim of the pod shell lies in contact with the outer support plate 30. Pod restraint latches 42 may be provided to secure the pod shell onto the outer support plate 30 when the pod is seated on the support plate assembly. The inner support plate 28 may include one or more kinematic or registration pins for mating with a corresponding number of kinematic or registration slots on the bottom of pod 32. The pins and slots together serve to position the pod properly on the support plate assembly. The load port 24 is affixed to the BOLTS interface 22 so that the support plate assembly 26 positions the pod 32 next to and at substantially the same elevation as a load port opening 44 on the process tool 20. The inner support plate 28 preferably includes a decoupling mechanism (not shown) for decoupling the pod door 36 from the pod shell 34. Although it is understood that various mechanisms may be used to decouple the pod door from the pod shell, an example of one such mechanism is disclosed in U.S. Pat. No. 4,995,430, entitled "Sealable Transportable Container Having Improved Latch Mechanism", to Bonora et al., which patent is owned by the assignee of the present invention, and which patent is incorporated by reference herein in its entirety.

As shown in FIGS. 3 and 4A–4C, load port 24 additionally includes a minienvironment 46 affixed on all sides and attached to the lower surface of outer support plate 30. Minienvironment 46 is preferably sealed at all times, either by inner support plate 28 or by pod shell 34 as explained hereinafter, and is capable of maintaining a clean volume of air. Minienvironment 46 may include a fan/filter unit 48 shown schematically in a lower portion of the minienvironment 46. The fan/filter 48 may maintain a positive pressure within the minienvironment relative to its surroundings, and may circulate clean air, nitrogen, an ionized gas, or other fluids for removing contaminants and/or deionizing the interior of the minienvironment 46.

In a preferred embodiment, the minienvironment may have a substantially rectangular footprint with a front wall and back wall having a length of approximately 14 inches, and side walls having a length of approximately 16 inches. The height of each of the walls is preferably about 28 inches. The front wall of the minienvironment 46 (i.e., that located proximate the BOLTS interface 22 and/or process tool 20) includes an opening 50 sufficiently large to allow a semiconductor wafer 40 and a semiconductor wafer access tool (not shown) to pass therethrough. It is understood that the configuration and dimensions of minienvironment 46 may vary in alternative embodiments, with the provision that the area inside the minienvironment be large enough to fully enclose the wafer cassette 38, and with the provision that the front wall of the minienvironment be at least as large as the port opening 44 for reasons explained hereinafter.

In an alternative embodiment of the present invention (not shown), it is understood that the minienvironment 46 may be comprised of expandable and collapsible telescopic walls, which in a collapsed position occupy a relatively small space, and in an expanded position define an interior area sufficiently large to fully enclose the wafer cassette 38. Further details relating to such a minienvironment are disclosed in U.S. patent application Ser. No. 08/730,643, entitled "Load Port Opener", by Rosenquist et al., which application is assigned to the owner of the present invention, and which application is incorporated herein by reference in its entirety.

As is further shown in FIGS. 3 and 4A–4C, the load port 24 preferably further includes a panel 52 attached to and extending up from the outer support plate 30 adjacent to the BOLTS interface 22. When the outer support plate lies in its home position surrounding the inner support plate, the panel 52 covers the port opening 44 to prevent particulates, ambient light, etc., from entering into the process tool. As the outer support plate 30 moves upward as explained hereinafter, the panel 52 moves upward with the plate 30 to thereby uncover the port opening 44.

Figure 4C:
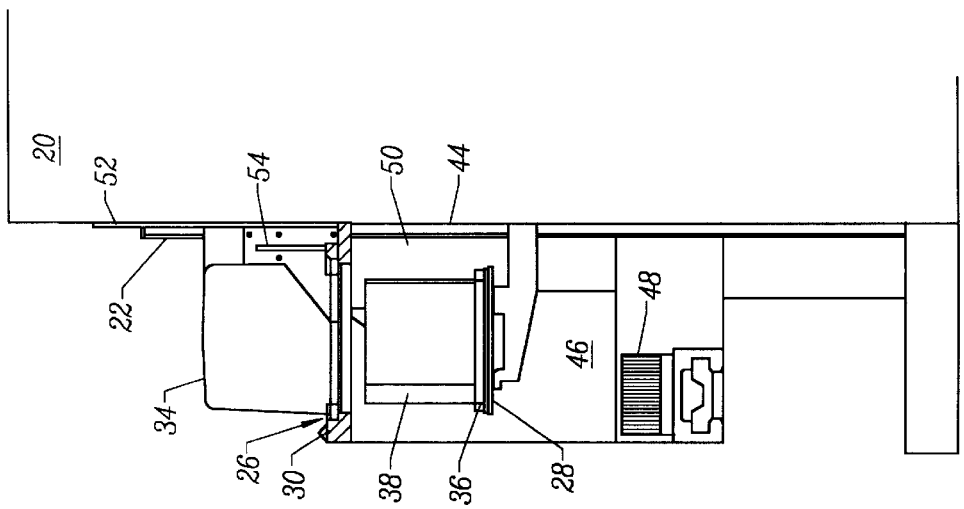
FIGS. 4A–4C are side views of a load port according to the present invention in various stages of enclosing the wafer cassette within the minienvironment.
Figure 4B:
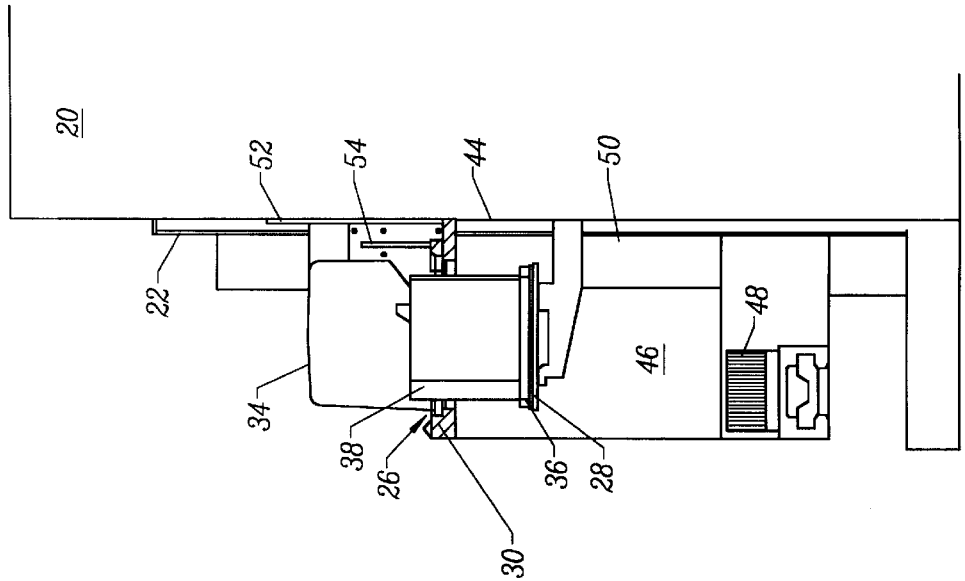
Figure 4A:
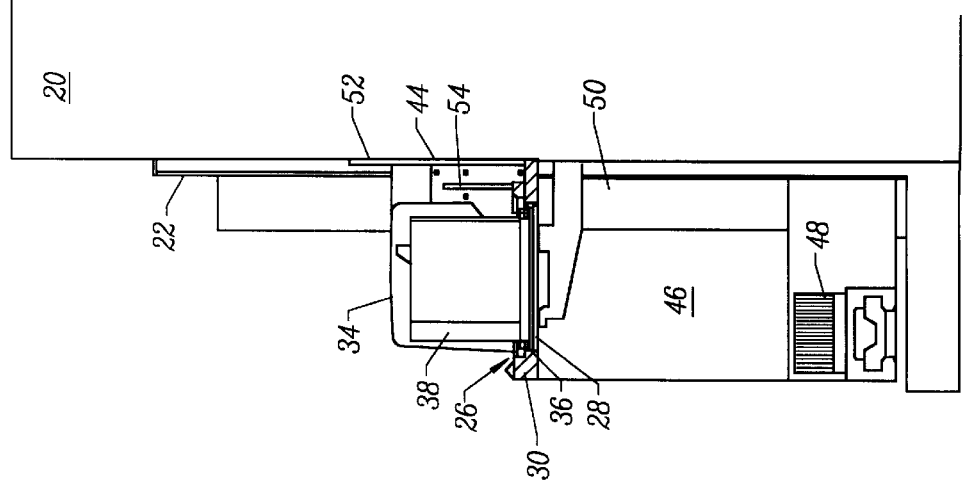
Figure 5:
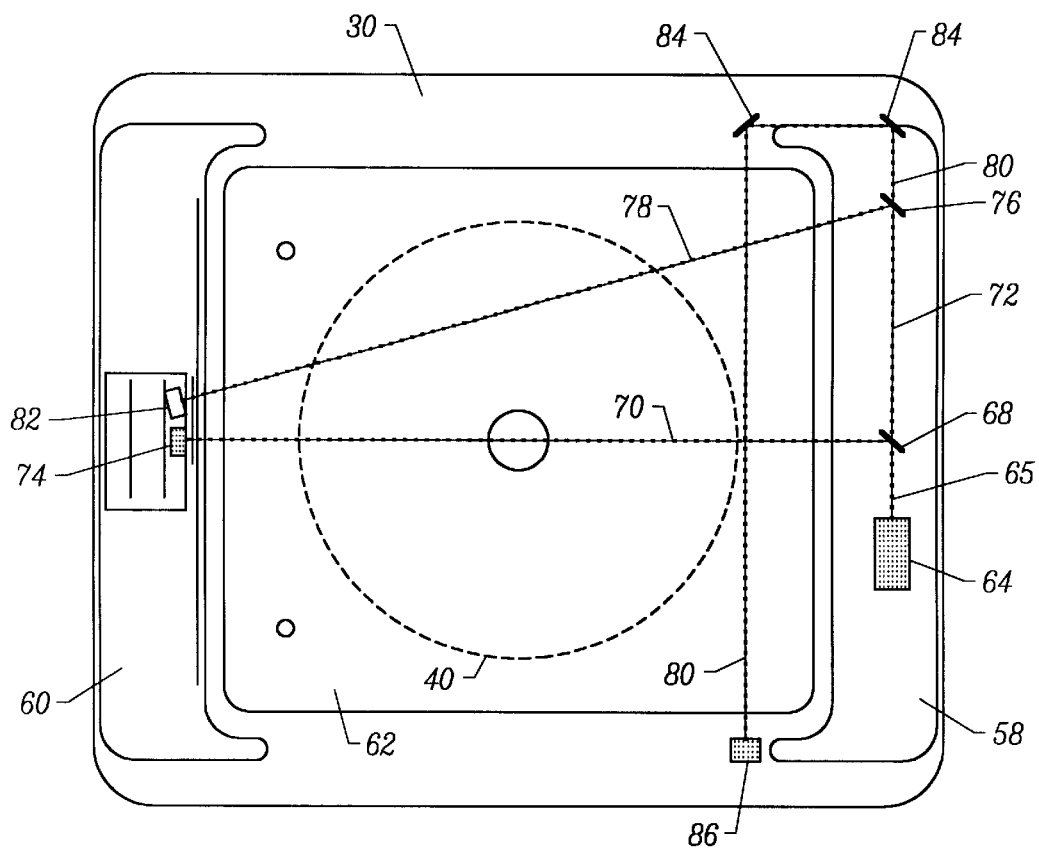
FIG. 5 is a top view of the support plate assembly including the optical detector system for wafer mapping, identification, and position verification.

Referring now to FIGS. 4A–4C, the outer support plate 30, and the minienvironment 46 and panel 52 attached thereto, are capable of translating up and down relative to the inner support plate 28 which in a preferred embodiment remains stationary. Those of skill in the art will appreciate that many mechanisms may be provided for raising and lowering the outer support plate 30, and elements affixed thereto. In one embodiment of the present invention, a pair of carriages 54 may be mounted to the sides of the outer support plate 30, which carriages 54 include threaded holes therethrough for riding along a pair of lead screws 56. In an alternative embodiment of the present invention, a single carriage 54 may be provided, as for example at a front of the outer support plate adjacent to the BOLTS interface 22, for riding along a single lead screw. Rotation of the lead screw(s) may be accomplished by a conventional driver such as a stepper motor (not shown), the operation of which motor being controlled by a computer, programmable logic controller or similar controller (not shown).

In operation, a pod 32 is loaded onto support plate assembly 26 either manually or by an automated system. Thereafter, the pod shell is secured to the outer support plate by the pod restraint latches 42, and the above-mentioned mechanisms within the inner support plate decouple the pod door from the pod shell. Next, the lead screws 56 are rotated to raise the outer support plate, and the minienvironment 46 and panel 52 affixed thereto. Additionally, the pod shell is affixed to and moves upward with the outer support plate to maintain a sealed minienvironment over the central opening in the outer support plate formerly occupied by the inner support plate. As previously indicated, while the outer support plate 30, the minienvironment 46, the panel 52 and the pod shell 34 move upward, the inner support plate 28, and the pod door 36 and wafer cassette 38 seated thereon, remain stationary.

Once the outer support plate is sufficiently raised with respect to the inner support plate, a wafer handling robot (not shown) from within the process tool passes through the now uncovered port opening 44 to access and transfer the wafers 40 between the wafer cassette 38 and the process tool 20. The outer support plate 30 will be sufficiently raised when the wafer cassette 38 is fully contained within the interior of the minienvironment 46 (as shown in FIG. 4C), or at least when an end effector (not shown) from within the process tool is able to pass through the port opening 44 to access an uppermost wafer 40 in the wafer cassette 38. While wafer transfer to and from the cassette occurs, the wafers are fully contained within the minienvironment 46 to maintain the wafers in a cleanroom environment while they are separated from the SMIF pod 32.

Once processing on the wafers is complete, and the wafers have once again been returned by the wafer handling robot to the wafer cassette, the outer support plate, minienvironment 46, panel 52, and pod shell 36 are once again lowered until the outer support plate is again substantially coplanar with the inner support plate and the panel 52 once again covers the port opening 44. The pod door may then once again be latched to the pod shell by the above-described mechanisms within the inner support plate, and the pod restraint latches 42 may be released to allow manual or automated transport of the pod 32 away from load port 24.

As indicated above, in a preferred embodiment, the inner support plate 28 remains stationary. However, in an alternative embodiment of the invention, it is contemplated that the inner support plate 28 be capable of translation. Any such translation would be independent of the translation of the outer support plate 30. For example, the inner support plate may be supported on an indexer (not shown), operated independently from the lead screws 56, for translating the inner support plate 28.

Additionally or alternatively, it is contemplated that the inner support plate 28 be capable of rotation either before, during or after translation of the outer support plate and components attached thereto. Details relating to a system wherein an inner support plate is capable of rotation are disclosed in U.S. pat. application Ser. No. 08/730,643, previously incorporated by reference. Rotation of the inner support plate would allow increased flexibility with regard to the orientation at which wafers may be accessed from the SMIF load port.

It is a further feature of the present invention that wafer mapping, identification, and position detection may be carried out as the outer support plate 30 moves upward with respect to the wafer cassette 38 seated on the inner support plate 28. Such an optical detector system will now be described with reference to FIG. 5. The outer support plate 30 includes a first mount 58 and a second mount 60 across a central aperture 62 from the first mount 58. The first and second mounts together house components of the optical detector system as described hereinafter. A laser diode emitter 64 is preferably mounted within the first mount 58 for emitting a beam 65. Although not critical to the present invention, the laser diode emitter 64 may be integrated with a regulated power supply circuit and a focusable culminating lens. The beam 65 is directed toward a beam splitter 68 oriented at 45° with respect to the beam 65 such that a first portion 70 of beam 65 is reflected across central aperture 62, and a second portion 72 of beam 65 is transmitted through the beam splitter 68. The beam portion 70 is received within a wafer present sensor 74 provided within the second mount 60 on the outer support plate 30. As the outer support plate 30 moves upward as previously described, the wafer present sensor 74 is able to detect the elevational position of each wafer 40 within the cassette 38. The beam portion 70 and sensor 74 may also be used to detect cross-slotted wafers, two wafers located within a single space, and the absence of a wafer from a particular slot. The information from cassette present sensor 74 may preferably be transferred to the control circuitry and stored into memory for wafer mapping. The stored information is available for use by the programmable logic controller or computer to accurately position the wafer handling robot for wafer retrievable without damage to the wafers. A flexible, shield and ribbon cable may be provided between the mounts 58 and/or 60 and the control system for transferring the positional information and of the signals. The beam portion 72 passing through the beam splitter 68 is further divided upon contact with a second beam splitter 76. The second beam splitter 76 is provided at an angle so as to reflect a portion 78 of the beam at an angle across the aperture in the outer support plate, to transmit a portion 80 therethrough. The beam portion 78 is received in a cassette slot sensor 82 provided in the second mount 60, which sensor 82 is aligned to receive the beam portion 78. The beam portion 78 is directed across the aperture 62 in the outer support plate 30 so as to pass through a portion of the wafer support slots (not shown) in a cassette. As the outer support plate 30 moves upward as described above, the beam portion 78 and cassette slot sensor 82 are able to detect the precise elevational position of a particular cassette slot. The information from the cassette slot sensor 82 may be transferred to the control circuitry and stored in memory for slot mapping, so that a wafer handling robot may be positioned to return a wafer to the cassette 38 at a known elevation of a particular cassette slot.

The one or more wafers 40 within a cassette 38 are conventionally held in their proper position within the cassette while the cassette is sealed within the pod. As the cassette does not move during separation of the cassette from the pod according to the present invention, it is unlikely that any of the wafers will improperly protrude from the cassette as the outer support plate moves upward. However, if for example, the load port 24 is subject to a shock as the outer support plate moves upward, one or more of the wafers may improperly protrude from the cassette. Moreover, as the wafer handling robot returns the wafers to the cassette, the robot may not fully seat the wafers within their respective slots and one or more of the wafers may protrude from the cassette.

Therefore, the beam portion 80 transmitted through the beam splitter 76 is reflected off of mirrors 84 which together reflect the beam portion 80 back 180° across a front section of the aperture 62, whereupon the beam portion 80 is received within a wafer protrusion sensor 86. As the outer support plate 30 moves upward and downward, the beam portion 80 and the wafer protrusion sensor 86 together detect any wafers which may be protruding beyond the front of a cassette. Upon activation of the sensor 86 by a protruding wafer 40, the control system causes a wafer seater mechanism (not shown) to move the out of position wafer into its proper location within the cassette 38. The beam portion 80 and wafer protrusion sensor 86 may additionally be used to detect the presence of a cassette on top of the inner support plate 28, which information may be forwarded to the control circuitry as described above. The optical detector system may further include an excessive wafer protrusion sensor (not shown) to sense any wafers which protrude too far out of the cassette to be reseated by the wafer seater mechanism.

While a preferred embodiment of the optical detector system has been described above, it is understood that other sensing mechanisms may be provided for detecting the position of a wafer and for allowing wafer mapping. For example, I/R or block-the-beam emitters and receivers may replace some or all portions of the beam emitted from diode 64 and the above-described sensors. Additionally, video cameras such as a CCD camera may be used. It is important that each of the portions of the beam emitted from the laser diode 64 travel in substantially horizontal planes. It is therefore a feature of the lead screws that they are capable of raising and lowering the outer support plate 30 through successive horizontal planes, substantially parallel to the planar surface of the wafers.

In an alternative embodiment of the present invention, the system allows automated transfer of a SMIF pod 32 to and from the load port 24 regardless of whether the pod is a 200 mm or 300 mm pod. Both 200 mm and 300 mm pods include similarly configured handles (not shown) on top of the pod, which handles are configured to be gripped by an automated pod transfer device. However, as conventional automated pod transfer devices are configured to encounter the pod top handle at a predetermined and constant elevation, and as the height of 200 mm and 300 mm pods are different, conventional automated pod transfer devices configured to transfer 300 mm pods could not also transfer 200 mm pods. However, such a feature is enabled by the present invention.

In particular, in this alternative embodiment, after wafer processing is completed and the pod door has been once again coupled to the pod top as explained above, the lead screws 56 may once again be rotated to raise the sealed SMIF pod to an elevation where the automated pod transfer device expects to encounter the pod handle 58 on a 300 mm pod. The automated transfer device may thereafter grip and transfer the 200 mm pod just as it would a 300 mm pod. It is understood that pods of various other sizes may be used. As long as the height of the pod and the height of the automated transport system is known, the load port may be controlled to raise the pod so that the pod handle lies at the appropriate transfer elevation. In addition to automated removal of a SMIF pod, the system may similarly load a 200 mm pod onto the load port via an automated 300 mm pod transfer system. In such embodiments, the outer support plate 30 is initially moved upward to an elevation where the automated pod transfer device may transfer the 200 mm pod onto the outer support plate 30. Thereafter, the outer support plate 30 may be lowered to properly seat the pod door 36 on the inner support plate 28. In this embodiment, it may be preferable that the inner support plate 28 translate upward and downward with the outer support plate 30 to maintain a sealed minienvironment during translation of the support surface without a pod seated thereon.

Embodiments of the invention are provided for allowing bottom opening pods, and an ergonomic load port adapted therefor, to be used together with the BOLTS interface. However, it is understood that in alternative embodiments, the present invention may be employed to allow a bottom opening pod and load port therefor to be used to transfer wafers from the bottom opening pod through a vertically oriented port in a process tool not including a BOLTS interface. Additionally, although embodiments of the present invention have been described thus far primarily with respect to a 200 mm system, it is understood that the present invention may be adapted to transfer wafers of varying sizes, including 300 mm wafers as well as wafers that may be smaller or larger than that, from a bottom opening cassette and load port to a BOLTS interface, or through a vertically oriented load port without a BOLTS interface.

In a further embodiment of the present invention, a load port configured for 300 mm bottom opening pods may be used to transfer 200 mm wafers through a BOLTS interface and/or a vertically oriented load port in a process tool. In such an alternative embodiment, an adapter plate may be affixed within a central portion of the outer support plate 30 for effectively converting the 300 mm load port to a 200 mm load port. Such an adapter plate is disclosed for example in U.S. Pat. No. 5,653,565, entitled "SMIF Port Interface Adaptor", to Bonora et al., which patent is owned by the assignee of the present invention, and which patent is incorporated by reference herein in its entirety.

The present invention may further comprise software included as part of the overall control system, which, in cooperation with various sensors on the load port, is capable of initially sensing whether 200 mm or 300 mm wafers are being processed by the load port and process tool. In particular, emitter/sensor pairs may be provided on the load port for sensing the size of the wafers within the pod or cassette on the load port. Based on the size of the wafers detected, the control system may automatically configure the wafer handling robot for the particular size wafer being processed, as well as for the particular pitch between the wafers. This may be particularly useful for the embodiment of the present invention including the above-described adapter plate which may operate with 200 mm or 300 mm wafers. However, even where a pod is configured to operate with only one or the other of the 200 mm or 300 mm wafers, such hardware and software would simplify the control system, as a single set of instructions can be used whether the fab is configured to work with 200 mm or 300 mm wafers.

Up to this point, the present invention has been described as operating with SMIF or compatible-type technology. However, a further embodiment of the present invention may be configured to operate in wafer fabs which do not utilize SMIF technology, or where a cassette is otherwise located on a load port of a process tool without initially being seated within a SMIF pod or similar container.

Figure 6:
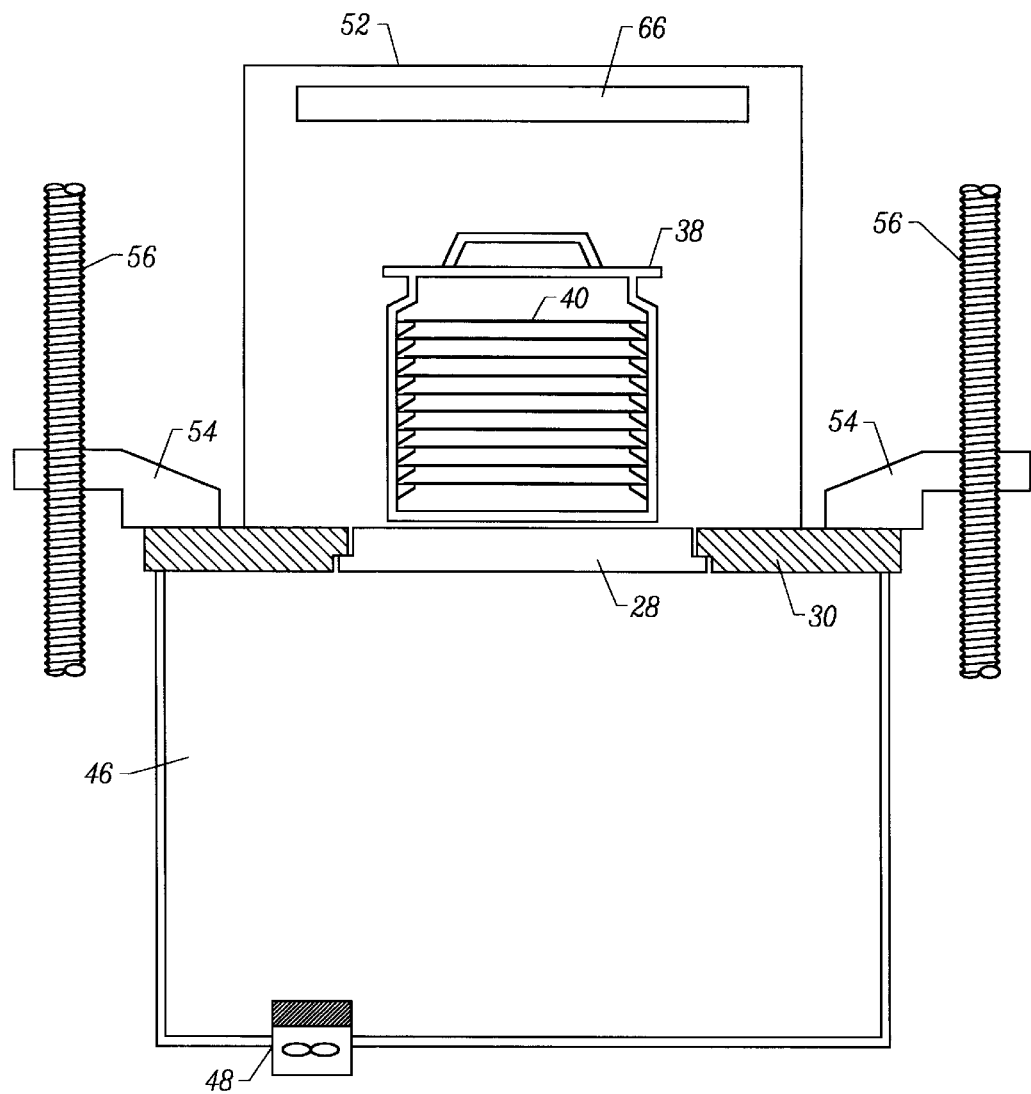
FIG. 6 is a perspective view of an alternative embodiment of the present invention for interfacing with a cassette not enclosed within the SMIF pod.
Figure 7:
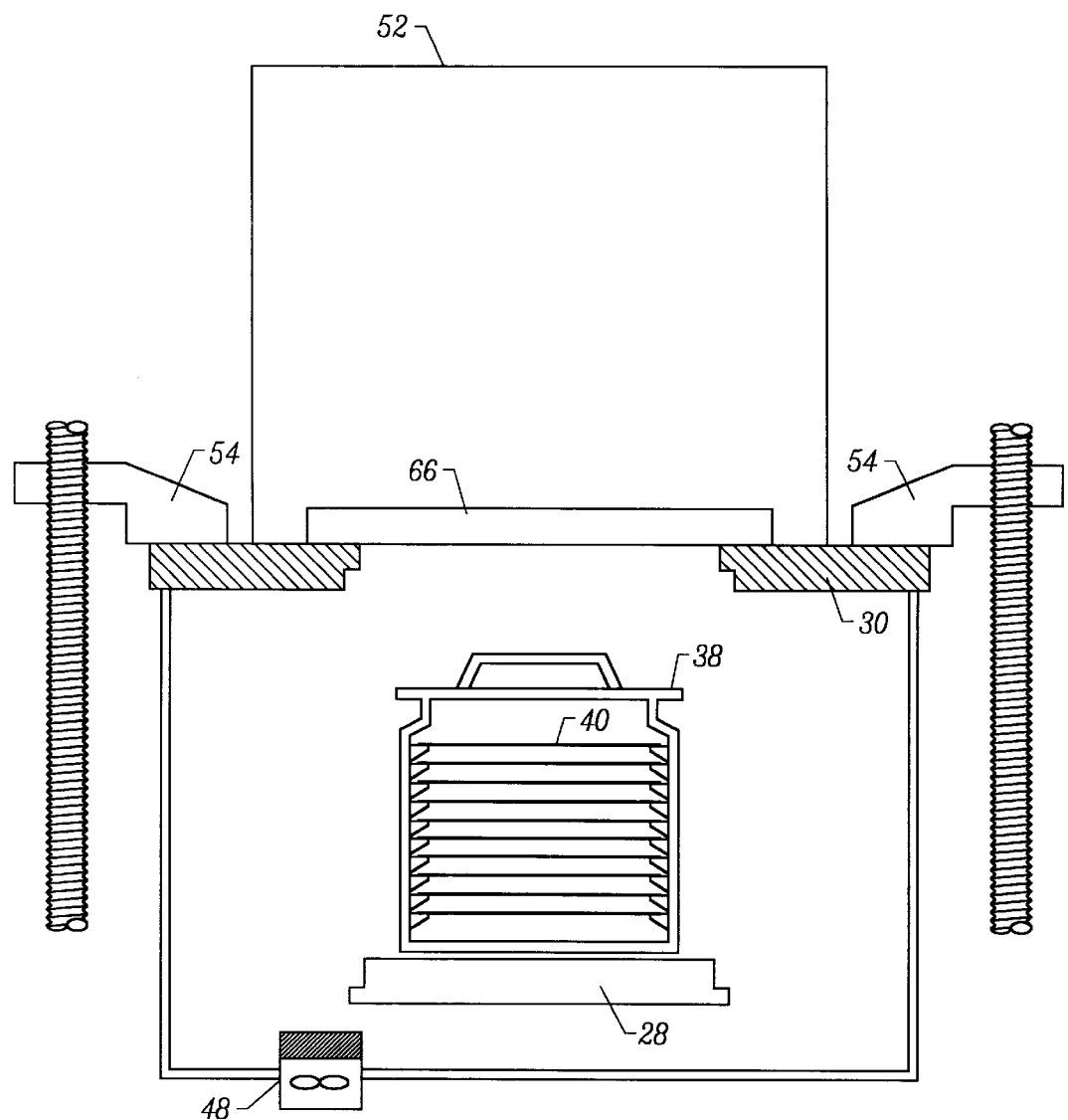
FIG. 7 is a front view of the cassette of FIG. 6 enclosed within a minienvironment according to the present invention.
Figure 8:
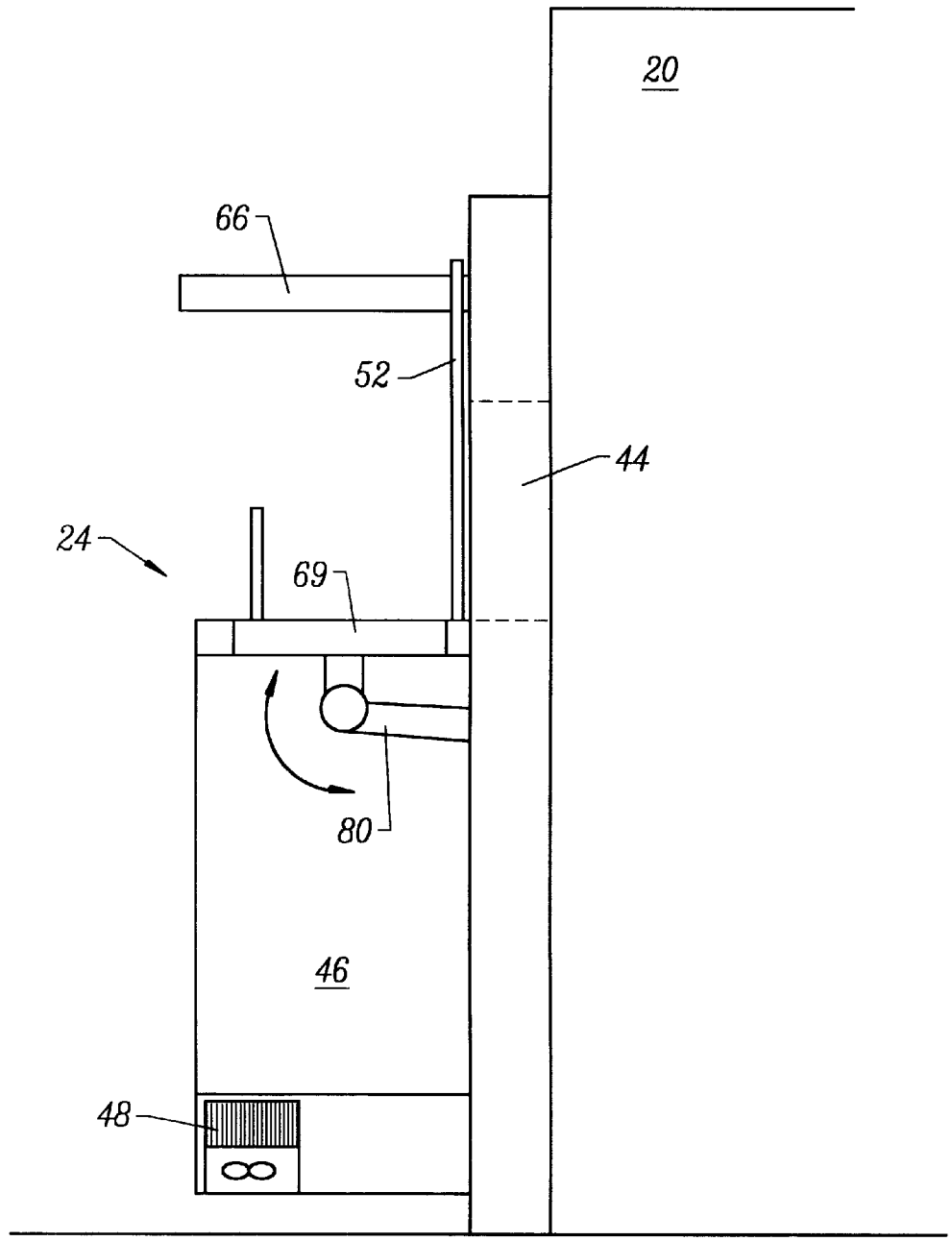
FIG. 8 is a side view of an alternative embodiment of the present invention including a support platform capable of tilting to initially accept a wafer cassette oriented at an angle.

Such an alternative embodiment is shown in FIGS. 6 and 7. As shown therein, a wafer cassette 38 is loaded onto a support plate assembly 26 including inner and outer support plates 28 and 30 as described above. A minienvironment 46 and panel 52 may be mounted to respective surfaces of the outer support plate as described above. According to the embodiment of FIGS. 6 and 7, a sealing plate 66 is additionally located at a height above the support plate assembly 26. A sufficient vertical distance is provided between the sealing plate and support plate assembly to allow the cassette to be seated in the space therebetween. In operation, once the cassette 38 is loaded onto the inner support plate 28, lead screws as described above may rotate to raise the outer support plate 30, minienvironment 46 and panel 52 upward until the upper surface of the outer support plate contacts the sealing plate 66 (FIG. 7) to thereby in effect provide a sealed minienvironment around the cassette while wafers are transferred between the cassette and the process tool. An elastomeric seal may be mounted in one or the other of juxtaposed surfaces of the outer support plate or sealing plate to enhance the seal formed therebetween. It is understood that the outer support plate 30 may be omitted in this alternative embodiment. In such a case, the outer edges of the minienvironment 46 would rise up around the inner support plate and cassette, and seal against the sealing plate as described above.

As described above, the minienvironment of the embodiment shown in FIGS. 6 and 7 may additionally include the fan/filter unit 48 for providing a positive pressure within the minienviromnent 46 to further eliminate particulates from within the enclosed volume of the minienvironment and to also condition the air within the minienvironment. It is understood that the embodiment of FIGS. 6 and 7 may operate without the sealing plate 66. In such an alternative embodiment, the clean air within the minienviromnent 46 may be maintained as a result of the positive flow of clean air from within the minienvironment to the surrounding environment as a result of the positive pressure generated by the fan/filter unit and/or from the positive gas flow from within the process tool. It is contemplated that the sealing plate may be a solid plate, or may include perforations to provide optimal air flow patterns around the cassette within the minienvironment.

In the embodiment of FIGS. 6 and 7, the carrier may initially be loaded onto a horizontally oriented support plate 69. However, it is occasionally desirable to transport wafers in either a vertical orientation or an orientation somewhere between the vertical and horizontal. Therefore, in an alternative embodiment to FIGS. 6 and 7 shown in FIG. 8, a support plate 69 may initially be oriented at a slant in preparation for receiving a cassette thereon. The support plate may be slanted at an angle of just greater than 0° to approximately 90° with respect to the horizontal. Such an embodiment would preferably include support columns 71 (one of which is shown) which together with the support plate 69 initially support the cassette as it is loaded onto the load port. A tilting mechanism 81 of known construction may be provided for tilting plate 69.

After the tilted cassette is loaded onto the support plate and support columns, the support plate may pivot by known pivoting mechanisms mounted under the support plate until the support plate and wafers within the wafer cassette are horizontally oriented. Thereafter, the wafers may be transferred into the vertically oriented port opening 44 in the process tool 20 in accordance with the various embodiments of the present invention as described above.

In addition to the obvious advantage of allowing wafer fabs to process both 200 mm, 300 mm and other size wafers within a single process tool, the present invention provides a great many other advantages regarding flexibility to semiconductor manufacturers and semiconductor equipment manufacturers. For example, wafer fabs that currently use 200 mm platforms can move to 300 mm-ready process tools while continuing to use 200 mm pods and load ports according to the present invention. This feature makes it easier and more efficient to change over from 200 mm to 300 mm platforms and tools. The present invention also in effect allows wafer fabs to use 200 mm versions of 300 mm tools.

Moreover, wafer fabs that are already using 300 mm platforms and tools can now utilize 200 mm wafers for operations such as wafer testing and tool monitoring. A large number of wafers are wasted in the testing of wafer properties and the monitoring and optimization of process tool operation. The present invention allows 300 mm fabs to perform these operations using much less expensive 200 mm wafers.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appending claims.

We claim:

1. An ergonomic system for transferring workpieces between a bottom opening SMIF pod and process tool through a vertically oriented port, said SMIF pod including a pod door and a pod shell, comprising:
    a load port including a horizontal surface located at a height of approximately 900 mm adapted to receive the SMIF pod, said load port capable of moving the pod shell away from the pod door, and said load port including a minienvironment for maintaining the workpieces in a volume of clean air while the pod shell is separated from the pod; and
    a box opener-loader tool standard ("BOLTS") interface on the tool, said load port capable of positioning said workpieces for transfer into said tool through said BOLTS interface.

2. A system for transferring workpieces to and from a processing tool through a vertical opening, the system comprising:
    a load port including a horizontal surface adapted to receive and support a bottom opening workpiece-carrying container, said load port capable of presenting a workpiece from within said bottom opening workpiece-carrying container for transfer through the vertical opening, said load port capable of operating with workpieces of a first size and workpieces of a second size different from said first size; and
    a sensor for determining whether said load port is operating with said workpiece of said first size or said second size.

3. A system for transferring workpieces to and from a processing tool as recited in claim 2 wherein said workpiece of said first size is 300 mm.

4. A system for transferring workpieces to and from a processing tool as recited in claim 3 wherein said workpiece of said second size is 200 mm.

5. A system for transferring workpieces to and from a processing tool as recited in claim 3 wherein said workpiece of said second size is 150 mm.

6. A system for transferring workpieces to and from a processing tool as recited in claim 2 wherein said load port includes mechanisms for separating a workpiece from within the container.

7. A system for transferring workpieces to and from a processing tool as recited in claim 2 wherein said load port includes a minienvironment for isolating a workpiece from an environment external to said bottom opening workpiece-carrying container and the processing tool.

8. A system for transferring workpieces to and from a processing tool as recited in claim 2 wherein said bottom opening workpiece-carrying container comprises a SMIF pod including a pod top and pod bottom.

9. A system for transferring workpieces to and from a processing tool as recited in claim 8 wherein said load port includes a mechanism for separating said pod top from said pod bottom.

10. A system for transferring workpieces to and from a processing tool as recited in claim 2, the system including a workpiece transfer robot for transferring workpieces, the system further comprising a control system for positioning the workpiece transfer robot to access said workpiece of said first size or said workpiece of said second size depending on feedback from said sensor.

11. A system for transferring workpieces to and from a processing tool as recited in claim 2, the system further comprising a control system for positioning the load port to accept said workpiece of said first size or said workpiece of said second size depending on feedback from said sensor.

12. A control system, run by software commands, for controlling operation of a system for transferring workpieces to and from a processing tool, the system including a physical interface affixed to the processing tool, said interface adapted for operation with a front opening workpiece-carrying container and said interface including a vertical opening through which workpieces may be transferred into and from the processing tool, and the system including a load port adapted to receive and support a first bottom opening container for carrying a first workpiece of a first size and a second bottom opening container for carrying a second workpiece of a second size, said first size being different than said second size, said load port capable of presenting said first and second workpieces from within said first and second bottom opening containers for transfer through said physical interface, and the system including a workpiece transfer robot for transferring workpieces between the load port and processing tool, the control system including:
    a sensor capable of distinguishing between the first and second sizes of the first and second workpieces; and
    an executable software code for positioning the workpiece transfer robot at a first group of locations appropriate for transferring the first workpiece between the first bottom opening container and the processing tool, or for positioning the workpiece transfer robot at a second group of locations appropriate for transferring the second workpiece between the second bottom opening container and the processing tool, depending on a feedback from said sensor.

13. A system for transferring workpieces to and from a processing tool, the system comprising:
    a physical interface affixed to the processing tool, said interface adapted for operation with a front opening workpiece-carrying container and said interface including a vertical opening through which workpieces may be transferred into and from the processing tool; and a load port adapted to receive and support a first bottom opening container for carrying a first workpiece of a first size and a second bottom opening container for carrying a second workpiece of a second size, said first size being different than said second size, said load port capable of presenting said first and second workpieces from within said first and second bottom opening containers for transfer through said physical interface.

14. A system for transferring workpieces to and from a processing tool as recited in claim 13 wherein said physical interface is adapted for operation with 300 mm workpieces.

15. A system for transferring workpieces to and from a processing tool as recited in claim 14 wherein said first workpiece is 300 mm and said second workpiece is 200 mm.

16. A system for transferring workpieces to and from a processing tool as recited in claim 13 wherein said load port includes mechanisms for separating a workpiece from within the container.

17. A system for transferring workpieces to and from a processing tool as recited in claim 13 wherein said load port includes a minienvironment for isolating a workpiece from an environment external to said first and second bottom opening workpiece-carrying containers and the processing tool.

18. A system for transferring workpieces to and from a processing tool as recited in claim 13 wherein said first and second bottom opening workpiece-carrying containers comprise SMIF pods, each said SMIF pod including a pod top and pod bottom.

19. A system for transferring workpieces to and from a processing tool as recited in claim 18 wherein said load port includes a mechanism for separating said pod top from said pod bottom.

* * * * *